(12) United States Patent
Kappes

(10) Patent No.: US 7,116,163 B2
(45) Date of Patent: Oct. 3, 2006

(54) BUFFER CIRCUIT

(75) Inventor: Michael S. Kappes, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 30 days.

(21) Appl. No.: 10/903,901

(22) Filed: Aug. 2, 2004

(65) Prior Publication Data

US 2006/0022754 A1    Feb. 2, 2006

(51) Int. Cl.
  *H03F 3/45*    (2006.01)
  *H03F 3/68*    (2006.01)
(52) U.S. Cl. .......................................... 330/69; 330/85
(58) Field of Classification Search ................ None
  See application file for complete search history.

(56) References Cited

U.S. PATENT DOCUMENTS

| | | | | |
|---|---|---|---|---|
| 3,249,883 A | * | 5/1966 | Berneike et al. ............ 330/295 |
| 5,300,896 A | * | 4/1994 | Suesserman ................ 330/260 |
| 5,621,357 A | * | 4/1997 | Botti et al. ................. 330/253 |
| 6,034,566 A | * | 3/2000 | Ohe ............................ 330/69 |
| 6,144,234 A | * | 11/2000 | Nakamura .................... 327/94 |
| 6,275,112 B1 | * | 8/2001 | Muza ......................... 330/296 |
| 6,359,512 B1 | * | 3/2002 | Ivanov et al. ............... 330/255 |
| 6,825,721 B1 | * | 11/2004 | Sanchez et al. ............ 330/253 |

\* cited by examiner

*Primary Examiner*—Robert Pascal
*Assistant Examiner*—Alan Wong
(74) *Attorney, Agent, or Firm*—Squire, Sanders & Dempsey, L.L.P.

(57) ABSTRACT

A buffer circuit comprised of two matched stages is provided. The first stage develops a replica voltage that is used in the second stage as the input to a wide-band amplifier. The combination of the two feedback loops in the circuit result in improved linearity. The first amplifier dominates for moderate frequencies while the second amplifier takes over for high frequencies.

18 Claims, 4 Drawing Sheets

BUFFER CIRCUIT

BACKGROUND OF THE INVENTION

1. Field of the Invention

The invention is related to the areas of buffers and buffer amplifiers, such as unity gain buffers and replica amplifiers.

2. Description of the Related Art

Buffer circuits are used to provide buffering between a first circuit and a second circuit. In other words, a buffer circuit is normally used to transfer voltage from a first circuit, having a high impedance level, to a second circuit with a lower impedance level. The interposed buffer circuit prevents the first circuit from unacceptably loading the second circuit and thus interfering with its desired operation.

If the voltage transferred is unchanged, the amplifier is known as a unity gain buffer. A simple unity gain buffer may be constructed by connecting the output of an operational amplifier to its inverting input, and using the non-inverting input. Other unity gain buffers may include an emitter follower, Darlington pair, or similar configurations using field effect transistors, vacuum tubes or other active devices.

Two preferred traits of a buffer amplifier are high input impedance and low output impedance. In addition, succeeding stages should be linear so as not to introduce distortion. As a result, there can be difficulty involved in designing a buffer stage that is linear and has sufficient bandwidth to process the signal with enough linearity such that distortions are not introduced. Feedback is typically used in this situation. However, there are limitations with respect to the amount of feedback that may be applied, the bandwidth of the feedback, and the loop gain that results.

In a related system, replica amplifiers may be used within a replica structure in order to predict a normal amplifier response and then couple the replica amplifier with a normal feedback amplifier such that the feedback system now only needs to do small corrective changes to the output. For example, if driving 1V into 1-ohm load, a replica amp may be used to supply the bulk of the current and the feedback amplifier can then operate with much lower currents.

Nevertheless, achieving both wide bandwidth and high linearity can be challenging. The previous topologies, discussed above, do not adequately address the need for wide bandwidth and high linearity within desirable power limitations. The claimed invention, however, is able to achieve higher linearity than previous solutions for a given power and area budget.

SUMMARY OF THE INVENTION

In one embodiment of the claimed invention, a buffer circuit is provided. The buffer circuit includes a first stage. The first stage includes a first amplifier and at least one device. The buffer circuit also includes a second stage. The second stage includes a second amplifier and at least two devices. The second stage forms an open loop between at least one of the devices and the second amplifier.

In another embodiment of the claimed invention, a buffer circuit is provided. The buffer circuit comprises a first amplifying means for receiving an input signal, and a first transistor means for receiving an input from a first amplifier and sending an output to the first amplifier, thereby forming a feedback loop. The circuit further includes a second transistor means for receiving an input from a first amplifier and a third transistor means for receiving an input from a second amplifier. The circuit also includes outputting means for outputting an output signal, wherein the output signal has low impedance.

In another embodiment of the claimed invention, a method of operating a buffer circuit is provided. The method includes the step of receiving an input signal at a first stage. The first stage includes a first amplifier and a first device. The method also includes the steps of sending a signal from the first amplifier to the first device and feeding back a signal from the first device to the first amplifier. The method further includes the step of sending a signal from the first stage to a second stage, the second stage including an open loop. The method also includes outputting, at the second stage, an output signal with low impedance.

BRIEF DESCRIPTION OF THE DRAWINGS

For proper understanding of the invention, reference should be made to the accompanying drawings, wherein.

DETAILED DESCRIPTION OF THE PREFERRED EMBODIMENT(S)

In one embodiment, the invention is intended for use as a buffer stage in a signal chain to drive low impedances or large capacitances with high linearity. The claimed invention may also be used as a reference voltage buffer where its wide bandwidth ensures power supply noise rejection at high frequencies.

Figure 1:
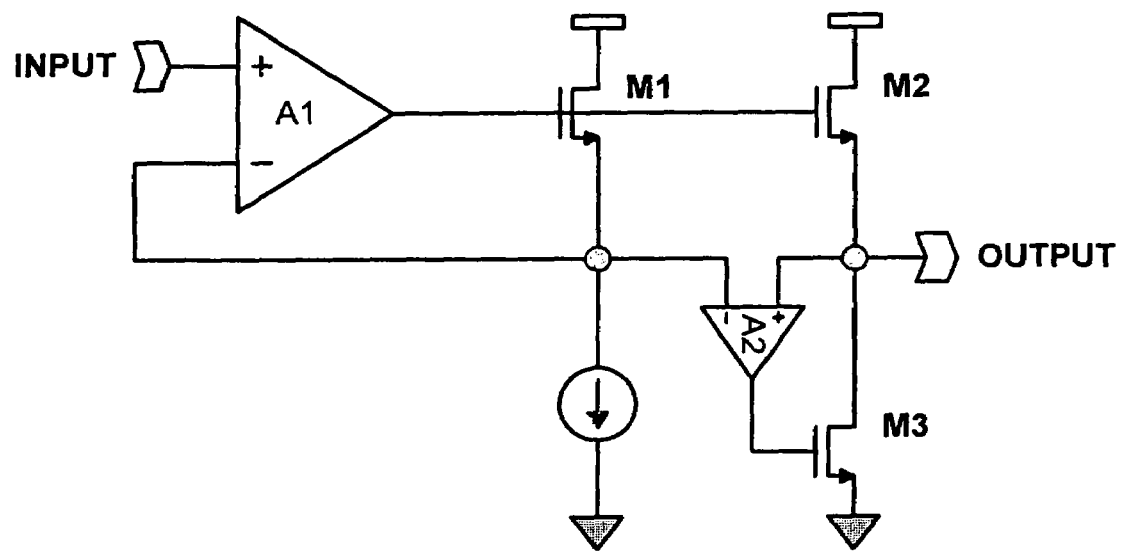
FIG. 1 illustrates a schematic diagram according to one embodiment of the invention.

One example of the invention can include amplifiers A1 and A2, as shown in FIG. 1. M1, M2, and M3 can be switch devices such as metal oxide semiconductor field effect transistors (MOSFET). Other types of field effect transistors, bipolar transistors, or comparable devices may also be used.

Referring to FIG. 1, the buffer circuit can include two matched stages with devices M1, and M2 and M3 respectively. They can be related 1:1 or with a scaling factor n:1 in order to save power. In this example, device M1 is included in the first stage which can be a replica stage that has a matched load to drive. It has a highly linear transfer function from the input to the source of M1 due to the loop gain provided by A1.

The second stage, illustrated by FIG. 1, can include M2 and M3. This second stage is connected to the output load. The device M2 may be considered an open-loop device, such that if the loads are matched exactly the output will exactly track the output of M1. The device M3 and amplifier A2 form a correction circuit (secondary loop) that corrects for load and device mismatches. The gain provided by M3 is low (it sees the source of M2 as a load), and as a result high gain is required in A2 to provide significant corrective action. Since A2 must only drive the gate of M3 it can have high bandwidth.

Therefore, in an embodiment of the invention, the linearity of the system is extended by applying two loops to the feedback around a source follower. A first loop makes the majority of the correction required to correct the non-linearity of the source follower stage and applies it in an open loop fashion. As a result, the secondary loop will not require as much loop gain because the source follower stage has already been linearized by the first loop. Consequently, the combination of the two loops will additively reduce distortion in the buffer stage.

Again referring to FIG. 1, M1 and A1 form a first stage including a closed loop between the two devices. The gate of M1 is also tied with M2, however A1 only sees the output of M1 and does not see the output of M2. The signal on the gate of M2 may be viewed as an open loop semi-corrective signal, so that as long as M1 and M2 match and their loads match, the new signal will be exactly what is needed for M2 to provide a perfectly linear signal. Therefore, a predictive signal that accounts for any nonlinearities in the translation of the signal from the gate of M1 to the source of M1 is provided. In this manner, the first stage develops a replica voltage.

The voltage developed by the replica stage is used in the second stage as an input to a wide-band amplifier A2. The solution provided in this example of the invention utilizes the first stage to approximate the signal required, and then uses the second amplifier to perform the remaining correction. Thus, if M1 receives a stable load and M2 receives a variable load, then A2 performs all of the correction with respect to the load, i.e. A2 handles the bulk of the load changes. The performance of the source follower is thereby augmented with an additional loop. The invention may allow M2 to provide a majority of current in signal transfer processing while M3 maintains access to the correction mechanism.

Utilizing this circuit configuration, the first amplifier dominates for moderate frequencies while the second amplifier takes over for high frequencies.

Figure 2:
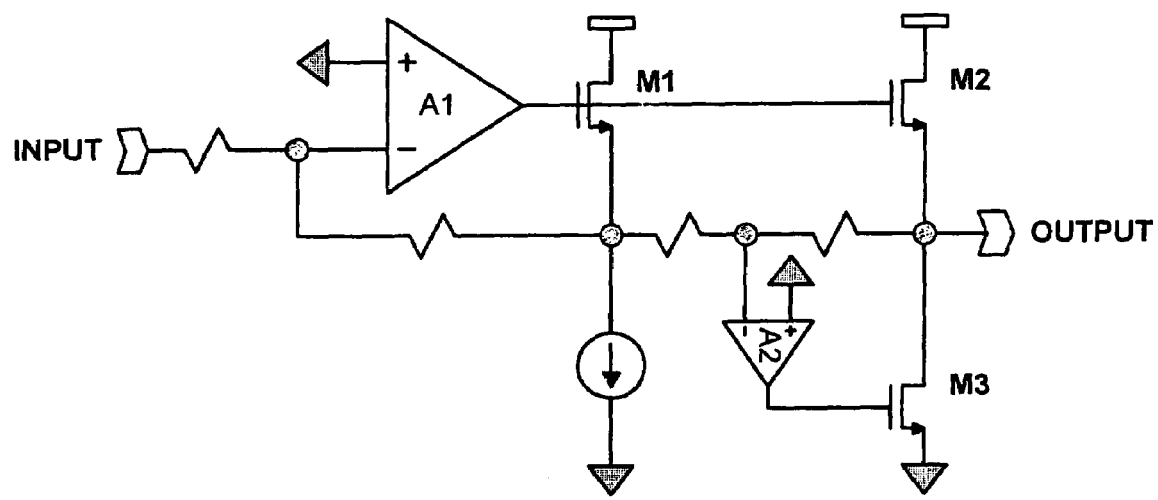
FIG. 2 illustrates a schematic diagram according to another embodiment of the invention.

FIG. 2 illustrates another embodiment of a circuit according to the invention. This second embodiment works with current rather than voltage in the processing stage. In FIG. 1, an input voltage is provided and voltage is sent to the sources of all the nodes. In FIG. 2, however, the input voltage is converted into a current by resistors, and from that point on, the circuit is comparing currents.

In FIG. 2, a feedback current, established between the resistor connecting the source of M1 back to A1, is provided. This feedback current forms the loop with M1 and A1. Another two resistors are connected to A2 in order to convert the voltage at the sources of M1 and M2, respectively, into currents. Processing of the current is performed with A2 and M3.

An advantage of the configuration provided by the embodiment illustrated in FIG. 2 is the lack of large signal voltages at the input of the amplifiers. By using resistors in this configuration, input swing signal voltage is reduced to a very small swing. Furthermore, swing is applied at the other end of the resistor terminal and the amplifiers will still have very small swings, thereby making it more amenable to large scale signal operation.

Additionally, the claimed invention is not limited to a unity gain situation. For example, the resistor ratio may be changed in order to provide the system with gain.

Figure 3:
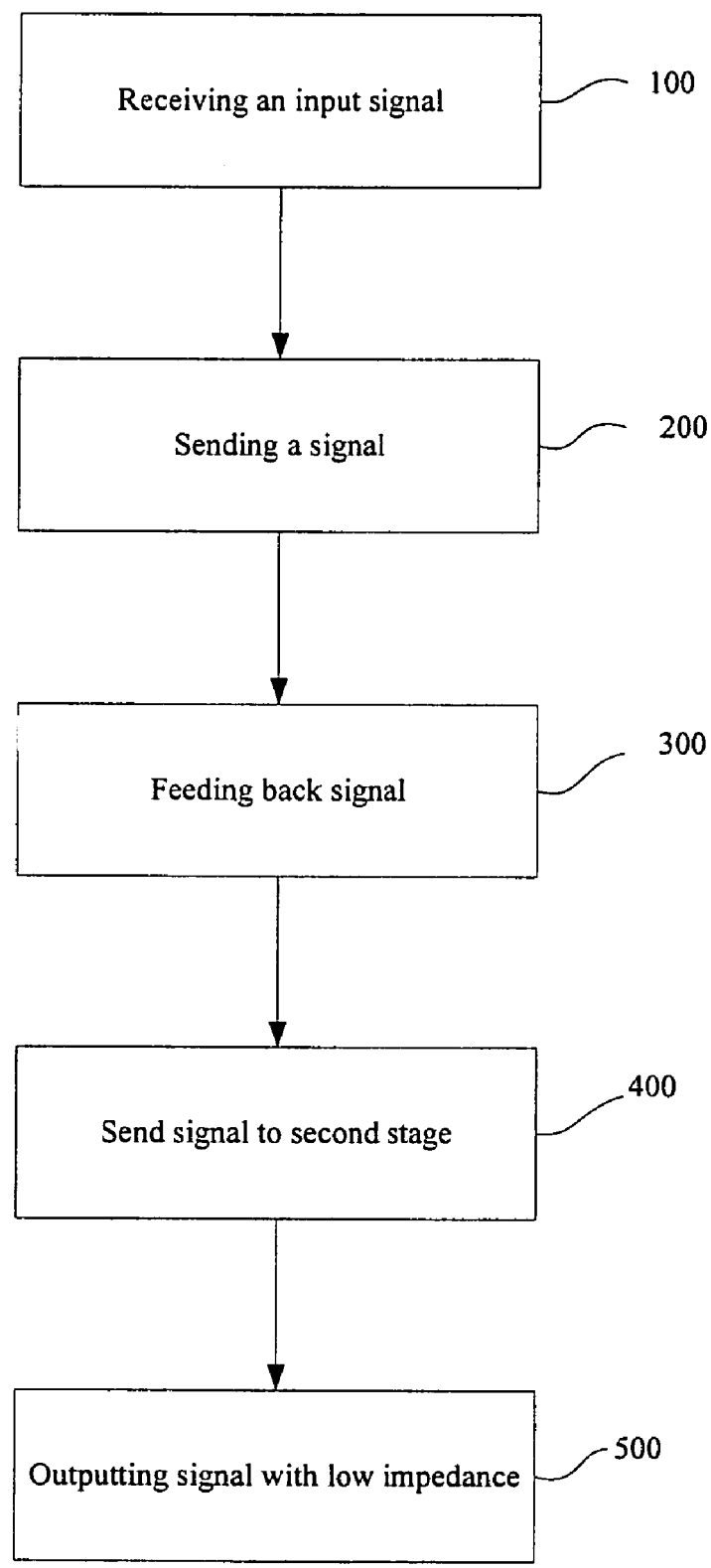
FIG. 3 illustrates a flow chart of a method according to one embodiment of the invention.
Figure 4:
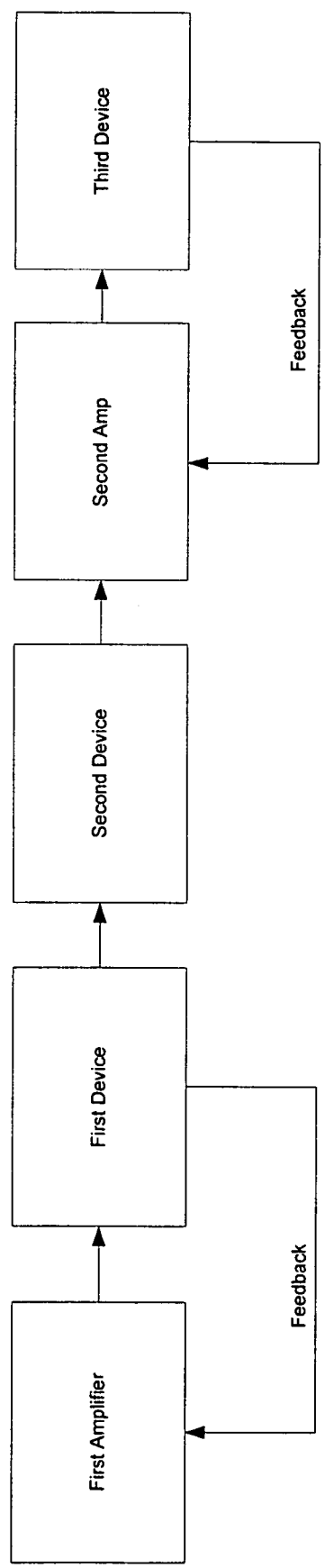
FIG. 4 illustrates a block diagram according to one embodiment of the invention.

FIG. 3 is a flow chart which is an example of a method of operating a circuit according to the invention. In step 100, a signal is received at a first stage. In step 200, a signal is sent from the first amplifier to a first device. In step 300, a signal is fed back from the first device to the first amplifier. In step 400, a signal is sent from the first stage to a second stage. In step 500, an output signal with low impedance is outputted.

Therefore, the circuit presented achieves higher linearity than other solutions for a given power and area budget. This is due, in part, to the complementary action of the two feedback loops. The primary loop reduces the burden of the secondary loop and thereby enhances the impact of the secondary loop's gain.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

I claim:

1. A buffer circuit, comprising:
   a first stage comprising a first amplifier and at least one device;
   a second stage comprising a second amplifier and at least two devices;
   wherein said second stage further comprises an open loop formed between at least one of said at least two devices and the second amplifier,
   wherein a negative input of the first amplifier is essentially directly connected to a negative input of the second amplifier; wherein control terminals of said at least one device and said at least one of said at least two devices are connected.

2. The circuit of claim 1, wherein the first stage further comprises a closed loop.

3. A buffer circuit, comprising:
   a first stage comprising a first amplifier and at least one device;
   a second stage comprising a second amplifier and at least two devices;
   wherein said second stage further comprises an open loop formed between at least one of said at least two devices and the second amplifier,
   wherein a negative input of the first amplifier is essentially directly connected to a negative input of the second amplifier,
   wherein at least one of said devices comprises a transistor.

4. The circuit of claim 3, wherein at least one of said devices comprises a field effect transistor.

5. The circuit of claim 3, wherein at least one of said devices comprises a metal oxide semiconductor field effect transistor (MOSFET).

6. The circuit of claim 3, wherein at least one of said devices comprises a bipolar transistor.

7. The circuit of claim 1, wherein said first amplifier is configured to receive an input voltage.

8. The circuit of claim 1, wherein said first amplifier is configured to receive a current.

9. The circuit of claim 1, wherein the circuit is configured to provide an output voltage.

10. The circuit of claim 1, wherein the first amplifier includes a negative feedback loop providing a negative feedback.

11. The circuit of claim 1, wherein a supply voltage is connected to at least one of the devices.

12. A buffer circuit, comprising:
    first amplifying means for receiving an input signal;
    first transistor means for receiving an input from a first amplifier and sending an output to the first amplifier;
    second transistor means for receiving an input from the first amplifier;

third transistor means for receiving an input from a second amplifier; and outputting means for receiving an input from the second transistor means and an input from the second amplifier and outputting an output signal, wherein said output signal has low impedance.

13. The circuit of claim 12, wherein said first amplifying means receives a voltage signal as the input signal.

14. The circuit of claim 12, wherein said first amplifying means receives a current as the input signal.

15. A method of operating a buffer circuit, comprising the steps of:

receiving an input signal at a first stage, said first stage comprising a first amplifier and a first device;

sending a signal from the first amplifier to the first device;

feeding back a signal from said first device to said first amplifier;

sending a signal from said first stage to a second stage, said second stage comprising an open loop;

outputting, at the second stage, an output signal with low impedance; wherein a negative input of the first stage is essentially directly connected to a negative input of the second stage.

16. The method of claim 15, wherein said step of receiving an input signal at a first stage further comprises receiving a voltage signal at a first amplifier.

17. The method of claim 16, wherein said step of receiving an input signal further comprises converting the voltage signal into a current.

18. The circuit of claim 1, wherein the negative input of the first amplifier is essentially directly connected to the negative input of the second amplifier by a resistor pair.

* * * * *